United States Patent [19]

Bok

[11] Patent Number: 5,843,627

[45] Date of Patent: Dec. 1, 1998

[54] METHOD FOR FORMING FINE PATTERNS OF SEMICONDUCTOR DEVICE

[75] Inventor: Cheol Kyu Bok, Ichon, Rep. of Korea

[73] Assignee: Hyundai Electronics Industries Co., Ltd., Ichon, Rep. of Korea

[21] Appl. No.: 669,618

[22] Filed: Jun. 24, 1996

[30] Foreign Application Priority Data

Jun. 26, 1995 [KR] Rep. of Korea .................. 1995-17481

[51] Int. Cl.⁶ ...................................................... G03F 7/40
[52] U.S. Cl. .......................... 430/328; 430/313; 430/325; 134/33; 134/902
[58] Field of Search ..................................... 430/311, 313, 430/315, 322, 324, 325, 328, 331; 134/26, 30, 33, 902

[56] References Cited

U.S. PATENT DOCUMENTS

| | | | |
|---|---|---|---|
| 4,902,608 | 2/1990 | Lamb | 430/325 |
| 5,252,430 | 10/1993 | Hashimoto et al. | 430/296 |
| 5,340,702 | 8/1994 | Hirasawa et al. | 430/326 |
| 5,476,753 | 12/1995 | Hashimoto et al. | 430/296 |
| 5,660,642 | 8/1997 | Britten | 134/30 |
| 5,667,922 | 9/1997 | Martiska | 430/9 |

*Primary Examiner*—Kathleen Duda
*Attorney, Agent, or Firm*—Thelen, Reid & Priest LLP

[57] ABSTRACT

There is provided a method for forming fine patterns in a semiconductor device without the falling down of the patterns, comprising the steps of: coating a photosensitive film on a wafer; patterning the photosensitive film by use of a light mask, followed by development, to form photosensitive film patterns; scattering a first washing solution on the wafer with spinning, to lie the first washing solution on the wafer including the photosensitive film patterns; scattering a second washing solution on the wafer to lie it thereon while spinning the wafer to remove the first washing solution out of the wafer; and spinning the wafer to dry the second washing solution.

5 Claims, 6 Drawing Sheets

METHOD FOR FORMING FINE PATTERNS OF SEMICONDUCTOR DEVICE

BACKGROUND OF THE INVENTION

1. FIELD OF THE INVENTION

The present invention relates to a method for forming fine patterns using warm deionized water or a liquid having low surface tension as a rinsing solution to prevent the patterns from falling down, which is useful in achieving high integration of semiconductor devices.

2. Description of the Prior Art

When forming fine patterns in a semiconductor device, dry development rather than wet development is usually adopted in order to prevent the falling of the patterns which occurs from the high surface tension of the deionized water.

A significant disadvantage of the former technique is that the patterns are damaged by plasma. In addition, the use of plasma increases the product cost because its equipment is very expensive. What is worse, it is difficult to apply dry development to mass production because of its low throughput which results mainly from a long process time.

In order to better understand the background of the invention, a description will be given of a conventional method of forming fine patterns in a semiconductor device, in connection with some drawings.

Referring to FIG. 1, there are cross sectional views illustrating stepwise processes of forming fine patterns.

First, according to the processes, a photosensitive film 2 is coated on a wafer substrate 1 and then soft baked, as shown in FIG. 1A.

FIG. 1B is a cross section after a light mask 3 is covered on the surface of the photosensitive film 2, followed by exposure of the photosensitive film 2 to light 4.

FIG. 1C is a cross section after the exposed areas of the photosensitive film 2 are removed using a developing solution, to form patterns 5.

FIG. 1D is a cross section after a washing solution is coated on the photosensitive film patterns and the exposed areas of the wafer substrate.

Thereafter, the wafer substrate 1 is spun at a high speed, to evaporate the washing solution 6, as shown in FIG. 1E During the complete evaporation of the washing solution, the photosensitive film patterns 5 fall down, as shown in FIG. 1F. This is attributed to a fact that deionized water, which is large in surface tension, is used as the washing solution.

In more detail, when deionized water completely covers a pattern and its neighboring patterns as shown in FIG. 1D, the deionized water serves as a filler so that the patterns may not fall down. However, when the deionized water starts to evaporate as shown in FIG. 1E, the patterns fall down due to the effect as if the filler were taken out.

Such falling becomes more serious as the washing solution has a larger surface tension and the aspect ratio of the pattern, a ratio of height to width, increases. Although there are differences according to the type of substrate, the falling of the patterns usually occurs at an aspect ratio of 5 or more. For example, on the basis of 256M DRAM in which a pattern is 0.25 $\mu$m wide, a pattern falls down when its thickness (or height) is about 1.25 $\mu$m.

In addition, a metalization process requires the photosensitive film to have a thickness of about 1.6 $\mu$m or more, aggravating the falling of such patterns.

As mentioned above, the conventional formation method of fine patterns is not pertinent to the high integration of semiconductor devices.

SUMMARY OF THE INVENTION

Therefore, it is an object of the present invention to overcome the above problems encountered in the prior art and to provide a method for forming fine patterns in a semiconductor device without the falling down of the patterns, which is useful in achieving high integration in semiconductor devices.

Based on intensive and thorough research by the present inventors, the above object can be accomplished by providing a method for forming fine patterns in a semiconductor device, comprising the steps of: coating a photosensitive film on a wafer; patterning the photosensitive film by use of a light mask, followed by development, to form photosensitive film patterns; scattering a first washing solution on the wafer with spinning, to lie the first washing solution on the wafer including the photosensitive film patterns; scattering a second washing solution on the wafer to lie it thereon while spinning the wafer to remove the first washing solution out of the wafer; and spinning the wafer to dry the second washing solution.

In accordance with an aspect of the present invention, there is provided a method for forming fine patterns in a semiconductor device, comprising the steps of: coating a positive photosensitive film on a wafer; patterning the positive photosensitive film by use of a light mask, followed by development, to form positive photosensitive film patterns; scattering deionized water on the wafer with spinning, to lie the water on the wafer including the photosensitive film patterns; scattering a liquid on the wafer to lie the liquid thereon while spinning the wafer to remove the deionized water out of the wafer, said liquid having a lower surface tension or a lower freezing point than deionized water; and spinning the wafer to dry the liquid.

In accordance with another aspect of the present invention, there is provided a method for forming fine patterns in a semiconductor device, comprising the steps of: making a wafer ready for the formation; coating a negative photosensitive film on the wafer; patterning the negative photosensitive film by use of a light mask, followed by development, to form negative photosensitive film patterns; scattering deionized water on the wafer with spinning, to lie the water on the wafer including the photosensitive film patterns; scattering deionized water warmed to room temperature or higher on the wafer to lie the warmed water thereon while spinning the wafer to remove the previous deionized water out of the wafer; irradiating light upon the warmed deionized water to crosslink the negative photosensitive film patterns; and spinning the wafer to dry the warmed deionized water.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
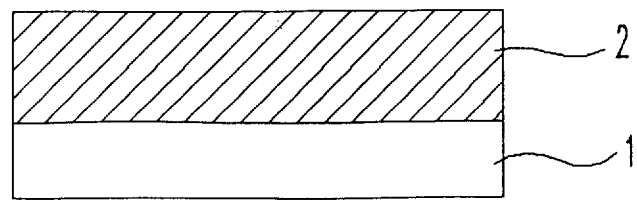
FIGS. 1A through 1F are cross sectional views illustrating a conventional method for forming fine patterns in a semiconductor device.
Figure 1B:
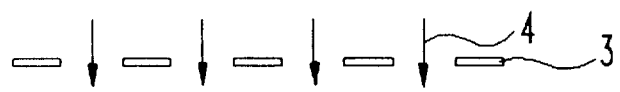
Figure 1B:
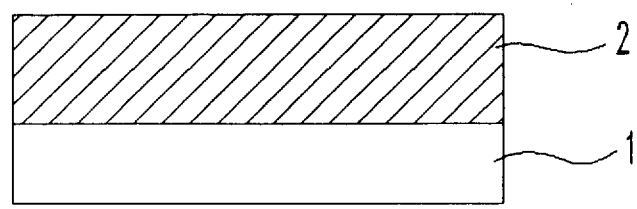
Figure 1C:
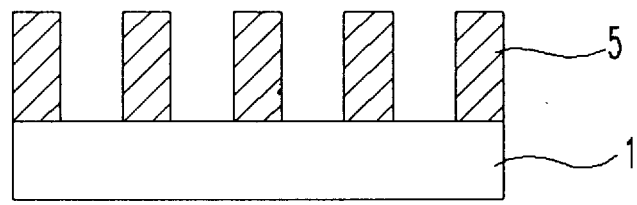
Figure 1D:
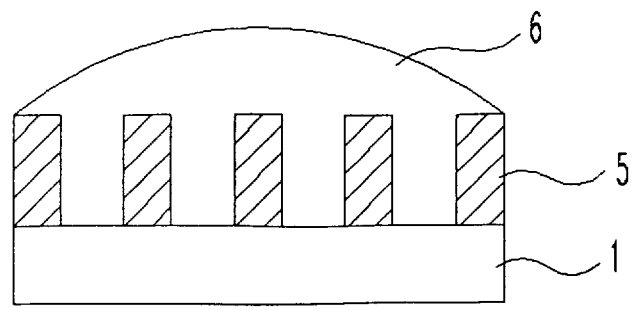
Figure 1E:
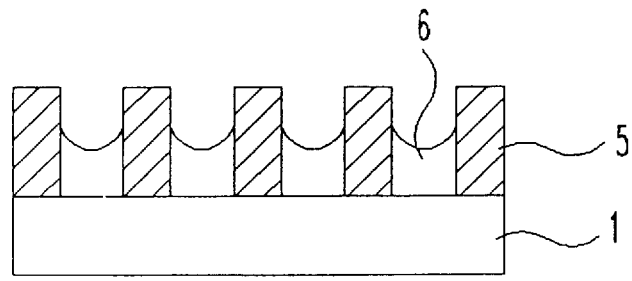
Figure 1F:
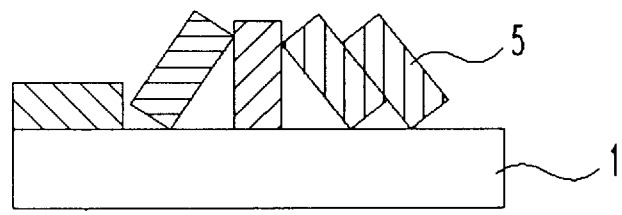

The application of the preferred embodiments of the present invention is best understood with reference to the accompanying drawings, wherein like reference numerals are used for like and corresponding parts, respectively.

FIGS. 2A through 2F illustrate stepwise processes of forming fine patterns in a semiconductor device, using positive photosensitive film patterns, in accordance with a first embodiment of the present invention.

Figure 2A:
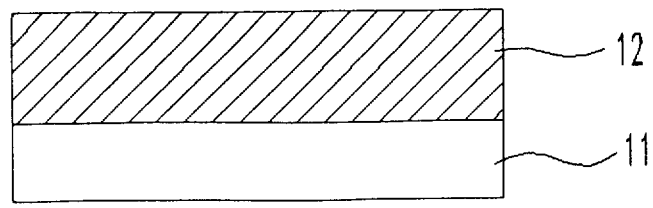
FIGS. 2A through 2F are cross sectional views illustrating a method for forming fine patterns in a semiconductor device, according to an embodiment of the present invention.

First, as shown in FIG. 2A, a photosensitive film 12 is coated on a wafer substrate 11 and then soft baked.

Figure 2B:
Figure 2B:
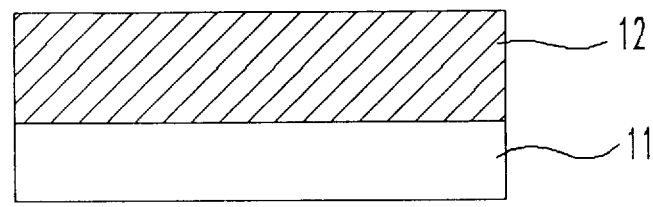

FIG. 2B is a cross section after a light mask 13 is covered on the surface of the photosensitive film 12, followed by exposure of the photosensitive film 12 to light 14.

Figure 2C:
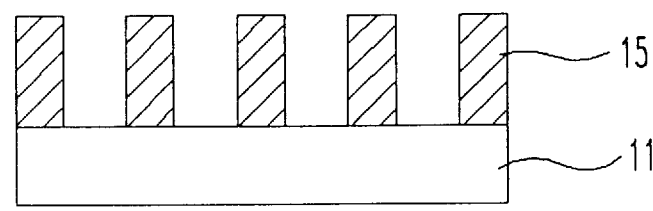

FIG. 2C is a cross section after, using a developing solution, the exposed areas of the photosensitive film 12 are eliminated, to form patterns 15.

Figure 2D:
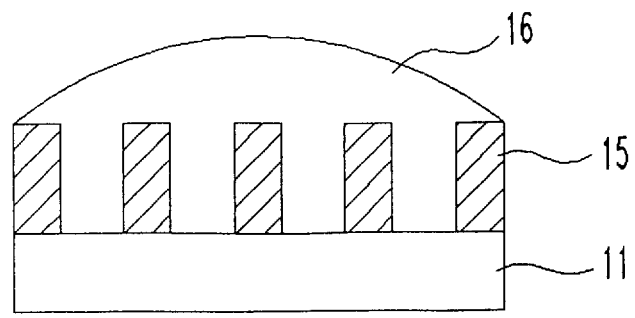

FIG. 2D is a cross section after the wafer substrate 11 is spun to scatter the remaining developing solution out, and simultaneously, a washing solution of deionized water 16 is distributed on the photosensitive film patterns 15 and the exposed areas of the wafer substrate.

Figure 2E:
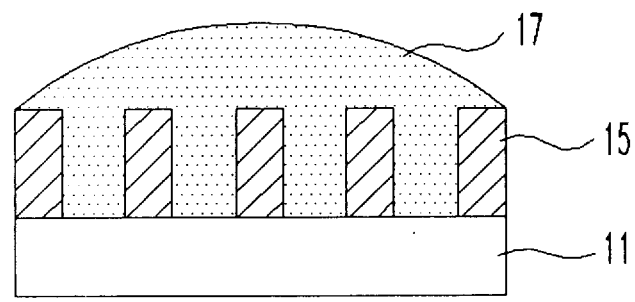

Thereafter, a similar process to that of FIG. 2D is carried out. That is, the wafer 11 is spun to scatter the first washing solution 16 out of the substrate and synchronously, a second washing solution 17 is provided to lie on the photosensitive film patterns 15 and the exposed areas of the wafer 11, as shown in FIG. 2E.

In accordance with the present invention, a mixture of deionized water and a liquid having a lower surface tension than that of deionized water, for example, a solution of alcohol in water, may be used as the second washing solution. Effective is isopropyl alcohol as the liquid of lower surface tension. Alternatively, a solution which is of lower freezing point than that of deionized water, e.g. 2-methyl-2-propanol, may be used. Since the freezing point of methyl propanol (25.6° C.) is slightly higher than room temperature, it starts to gradually freeze after being scattered on the wafer 11.

Figure 2F:
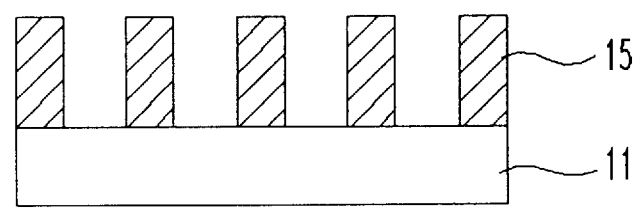

FIG. 2F is a cross section after the second washing solution is dried to leave the photosensitive film patterns 15 alone. In order to proceed with the solidification rapidly, this process is preferably carried out under vacuum.

Because the solidified methyl propanol evaporates as it stands, it does not induce elastic modulation so that the photosensitive film patterns 15 may stand as it is.

Referring to FIGS. 3A through 3F, there are stepwise illustrated processes of forming fine patterns in a semiconductor device, using negative patterns, in accordance with a second embodiment of the present invention.

Figure 3A:
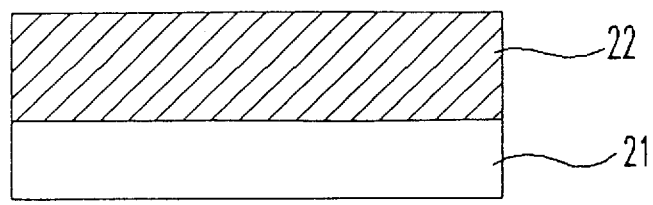
FIGS. 3A through 3F are cross sectional views illustrating a method for forming fine patterns in a semiconductor device, according to another embodiment of the present invention.

First, as shown in FIG. 3A, a negative photosensitive film 22 is coated on a wafer substrate 21 and then soft baked.

Figure 3B:
Figure 3B:
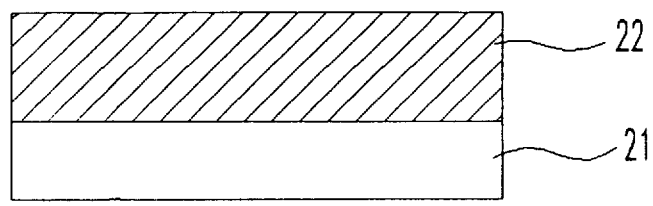

FIG. 3B is a cross section after a light mask 23 is covered on the surface of the negative photosensitive film 22, followed by exposure of the negative photosensitive film 22 to light 24.

Figure 3C:
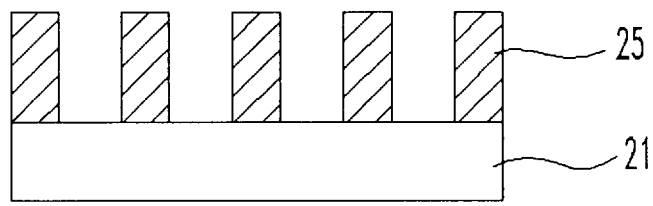

FIG. 3C is a cross section after, using a developing solution, the unexposed areas of the negative photosensitive film 22 are eliminated, to form negative photosensitive film patterns 25.

Figure 3D:
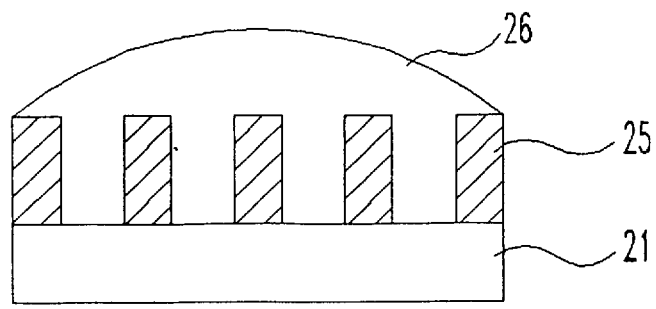

FIG. 3D is a cross section after the wafer substrate 11 is spun to scatter the remaining developing solution out, and simultaneously, a first washing solution of deionized water 26 is distributed on the negative photosensitive film patterns and the exposed areas of the wafer substrate 21.

Figure 3E:
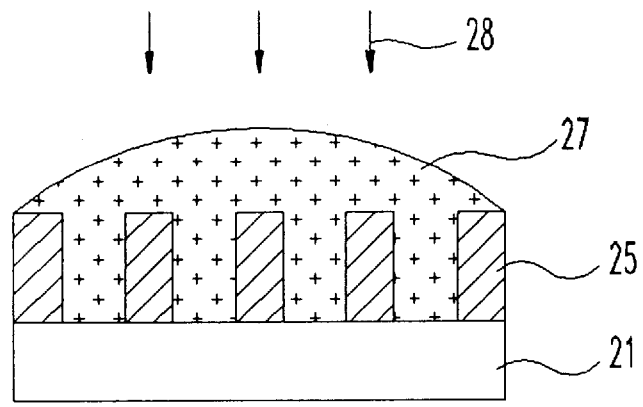

Thereafter, a similar process to that of FIG. 3D is carried out. That is, the wafer 21 is spun to scatter the first washing solution 26 out of the substrate and synchronously, a second washing solution 27 is provided to lie on the negative photosensitive film patterns 25 and the exposed areas of the wafer 21, as shown in FIG. 3E. Following this, the negative photosensitive film patterns 25 are crosslinked by irradiating light 28, such as an ultraviolet light or X-rays, on the second washing solution 27.

Figure 3F:
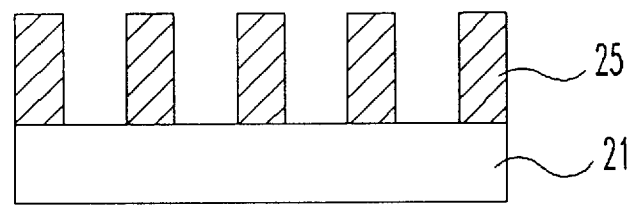

FIG. 3F is a cross section after the resulting wafer 21 is spun to dry the second washing solution 27.

In accordance with the present invention, the second washing solution 27 is deionized water, like the first washing solution but higher in temperature than the first. Preferred temperature of the second washing solution is on the order of room temperature to 100° C.

A higher temperature of the washing solution allows the negative photosensitive film to be more rapidly crosslinked, resulting in a stronger bond between the wafer 21 and the negative photosensitive film patterns 25 and thereby preventing them from falling down.

The crosslinking of the negative photosensitive film patterns is also obtained by the uv irradiation. That is, the falling down of the negative photosensitive film patterns can be prevented by use of either warm water or uv.

As described hereinbefore, the falling of the fine patterns can be prevented by a reduction in the surface tension of the washing solution and by reinforcement of the bonding between the patterns and the wafer substrate at the washing and drying processes of the wafer subsequent to the formation of the resist patterns.

Therefore, the method according to the present invention by which fine patterns can be efficiently prevented from falling down is useful in achieving high integration in semiconductor devices which requires particularly fine patterns.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming fine patterns in a semiconductor device, comprising the steps of:

coating a positive photosensitive film on a wafer;

patterning the positive photosensitive film by use of a mask, followed by development, to form positive photosensitive film patterns;

scattering deionized water on the wafer with spinning;

scattering a liquid on the wafer while spinning the wafer to remove the deionized water out of the wafer, said liquid having a lower surface tension or a lower freezing point than deionized water; and in a vacuum, carrying out a step of spinning the wafer to dry the liquid.

2. A method in accordance with claim 1, wherein:

said liquid is an aqueous solution in which deionized water is combined with a material of lower surface tension.

3. A method in accordance with claim 1, wherein: said liquid having the lower surface tension comprises isopropanol.

4. A method in accordance with claim 1, wherein: said liquid having the lower freezing point solution comprises methyl propanol.

5. A method for forming fine patterns in a semiconductor device, comprising the steps of:

coating a negative photosensitive film on a wafer;

patterning the negative photosensitive film by use of a mask to form negative photosensitive film patterns, the negative photoresist being cross-linked upon a first exposure with a first irradiation;

scattering deionized water on the wafer with spinning;

scattering deionized water warmed to room temperature on the wafer while spinning the wafer to remove the previous deionized water out of the wafer; to irradiating light upon the warmed deionized water.

spinning the wafer to dry the warmed deionized water.

* * * * *